United States Patent
Kim et al.

(10) Patent No.: US 11,856,680 B2
(45) Date of Patent: Dec. 26, 2023

(54) SYSTEM FOR PROCESSING SUBSTRATE

(71) Applicant: SEMES CO., LTD., Chungcheongnam-do (KR)

(72) Inventors: Sun Whan Kim, Gyeonggi-do (KR); Byung Du Jeon, Chungcheongnam-do (KR)

(73) Assignee: Semes Co., Ltd., Chungcheongnam-do (KR)

( * ) Notice: Subject to any disclaimer, the term of this patent is extended or adjusted under 35 U.S.C. 154(b) by 229 days.

(21) Appl. No.: 17/243,954

(22) Filed: Apr. 29, 2021

(65) Prior Publication Data

US 2021/0360767 A1    Nov. 18, 2021

(30) Foreign Application Priority Data

May 13, 2020    (KR) .................... 10-2020-0056971

(51) Int. Cl.
| | |
|---|---|
| *H05F 3/02* | (2006.01) |
| *H01L 21/67* | (2006.01) |
| *H01L 21/687* | (2006.01) |
| *B08B 3/02* | (2006.01) |
| *B08B 13/00* | (2006.01) |

(52) U.S. Cl.
CPC ............. *H05F 3/02* (2013.01); *B08B 3/02* (2013.01); *B08B 13/00* (2013.01); *H01L 21/67051* (2013.01); *H01L 21/68764* (2013.01); *H01L 21/67023* (2013.01)

(58) Field of Classification Search
CPC .. H05F 3/02; B08B 13/00; B08B 3/02; H01L 21/68764; H01L 21/67051; H01L 21/67023
See application file for complete search history.

(56) References Cited

U.S. PATENT DOCUMENTS

| | | | |
|---|---|---|---|
| 8,659,861 B2 | 2/2014 | Furutani | |
| 9,491,840 B2 * | 11/2016 | Chang | ............... H01L 23/49827 |
| 2014/0167799 A1 * | 6/2014 | Wang | ............... H05F 3/02 |
| | | | 361/220 |

(Continued)

FOREIGN PATENT DOCUMENTS

KR    20120073305 A    7/2012

OTHER PUBLICATIONS

Korean Request for the Submission of an Opinion for Korean Application No. 10-2020-0056971, dated Jan. 16, 2023 with translation, 6 pages.

*Primary Examiner* — Benjamin L Osterhout
(74) *Attorney, Agent, or Firm* — RatnerPrestia

(57) ABSTRACT

A substrate processing system capable of setting a stable reference ground level for electrical components while handling electrostatic discharge (ESD) is provided. The substrate processing system includes a first ground bar connected to a building ground; and a second ground bar connected to the building ground and physically separated from the first ground bar, wherein the first ground bar is connected to a first electrical component to set a ground level of the first electrical component, wherein the second ground bar is dedicated to a charged component, and the second ground bar is connected to the first charged component to set a path of the electrostatic discharge current generated by the first charged component.

20 Claims, 10 Drawing Sheets

(56) References Cited

U.S. PATENT DOCUMENTS

| | | | |
|---|---|---|---|
| 2015/0079735 A1* | 3/2015 | Chang | H05F 3/02 438/597 |
| 2021/0090911 A1* | 3/2021 | Hong | H01L 21/67051 |
| 2021/0193647 A1* | 6/2021 | Ma | H01L 27/0296 |

* cited by examiner

| H1 − H4 | > | H2 − H3 |

SYSTEM FOR PROCESSING SUBSTRATE

CROSS REFERENCE TO RELATED APPLICATION

This application claims the benefit of Korean Patent Application No. 10-2020-0056971, filed on May 13, 2020, in the Korean Intellectual Property Office, the disclosure of which is incorporated herein by reference in its entirety.

FIELD OF THE INVENTION

The present invention relates to a substrate processing system.

BACKGROUND

When manufacturing a semiconductor/display device, various processes such as photography, etching, ashing, ion implantation, thin film deposition, and cleaning are performed. In particular, various contaminants (e.g., particles, organic contaminants, metal contaminants, etc.) remaining on the substrate greatly affect the production yield. Therefore, a cleaning process is performed before and after each unit process of manufacturing a semiconductor/display device.

SUMMARY OF THE INVENTION

Meanwhile, the substrate processing apparatus should be grounded for safety and proper operation. The frame of the substrate processing apparatus that does not use a processing liquid may be made of a steel material through which electric current can flow. Various electrical components in the substrate processing apparatus may be directly connected to a steel frame, and the frame may be connected to a building ground.

However, a frame of a substrate processing apparatus using a processing liquid (e.g., a cleaning facility or a photo facility) may be made of a coated steel material to prevent corrosion by the processing liquid. Therefore, various electrical components in the substrate processing apparatus cannot be directly connected to the frame.

The problem to be solved by the present invention is to provide a substrate processing system capable of setting a stable reference ground level of an electrical component while handling electrostatic discharge (ESD).

The problems of the present invention are not limited to the problems mentioned above, and other problems that are not mentioned will be clearly understood by those skilled in the art from the following description.

An aspect of the substrate processing system of the present invention for achieving the above object comprises a first ground bar connected to a building ground; and a second ground bar connected to a building ground and physically separated from the first ground bar, wherein the first ground bar is connected to a first electrical component to set a ground level of the first electrical component, wherein the second ground bar is directed to a charged component, and the second ground bar is connected to a first charged component to set a path of an electrostatic discharge current generated by the first charged component. Optionally, the first ground bar may be used exclusively for electrical components.

Another aspect of the substrate processing system of the present invention for achieving the above object comprises a first electrical box including a first ground bar connected to a building ground, and a second ground bar connected to the building ground and physically separated from the first ground bar; a second electrical box including a third ground bar and a fourth ground bar physically separated from each other; and a third electrical box including a fifth ground bar and a sixth ground bar physically separated from each other, wherein a first wiring tree connects the first ground bar, the third ground bar, and the fifth ground bar, wherein a second wiring tree connects the second ground bar, the fourth ground bar, and the sixth ground bar, wherein the first wiring tree is not connected to the fourth ground bar and the sixth ground bar.

An aspect of the system of the present invention for achieving the above object comprises a first electrical box including a first ground bar connected to a building ground, and a second ground bar connected to the building ground and physically separated from the first ground bar; a second electrical box including a third ground bar and a fourth ground bar physically separated from each other; a third electrical box including a fifth ground bar and a sixth ground bar physically separated from each other; a first electrical component connected to a building ground through a third ground bar and a first ground bar; a second electrical component connected to a building ground through a fifth ground bar and a first ground bar; a first charged component connected to a building ground through a fourth ground bar and a second ground bar; and a second charged component connected to a building ground through a sixth ground bar and a second ground bar, wherein when static electricity is generated in the second charged component, a voltage level of a third ground bar to a sixth ground bar increases, but difference between a voltage level of the third ground bar and a voltage level of the fifth ground bar is smaller than difference between a voltage level of the fourth ground bar and a voltage level of the sixth ground bar.

Details of other embodiments are included in the detailed description and drawings.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION OF THE INVENTION

Figure 1:
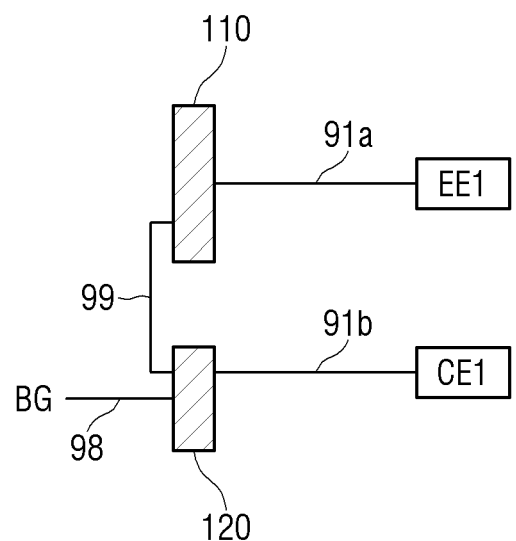
FIG. 1 is a block diagram for describing a substrate processing system according to a first embodiment of the present invention.

Hereinafter, preferred embodiments of the present invention will be described in detail with reference to the accompanying drawings. Advantages and features of the present invention, and methods for achieving them will be clarified with reference to embodiments described below in detail together with the accompanying drawings. However, the present invention is not limited to the embodiments disclosed below, but may be implemented in various different forms, and only the embodiments allow the publication of the present invention to be complete, and are provided to fully inform those skilled in the technical field to which the present invention pertains of the scope of the invention, and the invention is only defined by the scope of the claims. The same reference numerals refer to the same elements throughout the specification.

When components/parts/elements are referred to as "on" or "above" of other components/parts/elements, it includes not only when directly above of the other components/parts/elements, but also other components/parts/elements intervened in the middle. On the other hand, when components/parts/elements are referred to as "directly on" or "directly above," it indicates that no other component/part/element is intervened therebetween.

The spatially relative terms "below," "beneath," "lower," "above," "upper," etc., as shown in figures, can be used to easily describe the correlation of components or elements with other components or elements. The spatially relative terms should be understood as terms including the different direction of the component in use or operation in addition to the direction shown in the figure. For example, if the component shown in the figure is turned over, a component described as "below" or "beneath" the other component may be placed "above" the other component. Accordingly, the exemplary term "below" can include both the directions of below and above. The component can also be oriented in other directions, so that spatially relative terms can be interpreted according to the orientation.

Although the first, second, etc. are used to describe various components, elements and/or sections, these components, elements and/or sections are not limited by these terms. These terms are only used to distinguish one component, element, or section from another component, element or section. Therefore, first component, the first element or first section mentioned below may be a second component, second element, or second section within the technical spirit of the present invention.

The terminology used herein is for describing the embodiments and is not intended to limit the present invention. In the present specification, the singular form also includes the plural form unless otherwise specified in the phrase. As used herein, "comprises" and/or "comprising" means that the elements, steps, operations and/or components mentioned above do not exclude the presence or additions of one or more other elements, steps, operations and/or components.

Hereinafter, exemplary embodiments of the present invention will be described in detail with reference to the accompanying drawings, and in the description with reference to the accompanying drawings, the same or corresponding elements are assigned the same reference numbers regardless of reference numerals, and the description overlapped therewith will be omitted.

FIG. 1 is a block diagram for describing a substrate processing system according to a first embodiment of the present invention.

Referring to FIG. 1, the substrate processing system according to the first embodiment of the present invention includes a first ground bar 110, a second ground bar 120, a first electrical component (EE1), and a first charged component (CE1).

The substrate processing system according to the first embodiment of the present invention may be a substrate processing system using a processing liquid (e.g., a cleaning facility or a photo facility). In order to prevent the frame (e.g., steel material) from being corroded by the processing liquid, the frame may be in a coated state. Accordingly, the substrate processing system according to the first embodiment of the present invention does not directly use a frame to create a ground structure, but uses separate ground bars 110 and 120.

The first ground bar 110 may be electrically connected to the building ground (BG), and may be connected to an electrical component. Optionally, the first ground bar 110 may be used exclusively for electrical components. Electrical components refer to components that operate by receiving electricity. For example, the electrical component may be a motor, a heater, or a sensor, but is not limited thereto. Further, the electrical component may operate by receiving an alternating current (AC) voltage or operate by receiving a direct current (DC) voltage. For example, the motor may be provided with an AC voltage of, for example, about 220V, and the sensor may be provided with a DC voltage of about 24V. Here, the DC voltage may be generated by rectifying the AC voltage.

The first ground bar 110 is electrically connected to the first electrical component (EE1) to set the ground level (reference level) of the first electrical component (EE1). The first electrical component (EE1) may communicate with another electrical component (not shown) or a controller (not shown) in the substrate processing system. A reference level is required for signals provided from other electrical components or controllers, and signals provided to other electrical components or controllers. The ground level of the first ground bar 110 may be used to set this reference level.

Specifically, the first electrical component (EE1) is connected to the first ground bar 110 through the wiring 91*a*, the first ground bar 110 is connected to the second ground bar 120 through the wiring 99, and the second ground bar 120 is connected to the building ground (BG) through the wiring 98. Accordingly, the first electrical component (EE1) is connected to the building ground (BG) through the wiring 91*a*, the first ground bar 110, the wiring 99, the second ground bar 120 and the wiring 98. Accordingly, the reference level (ground level) of the first electrical component (EE1) becomes the building ground (BG).

Meanwhile, unlike illustrated, the first ground bar 110 may be directly connected to the building ground (BG) without passing through the second ground bar 120. That is, the first ground bar 110 may be connected to the building ground (BG) through a separate wiring.

The second ground bar 120 may be connected to the building ground (BG) and, as illustrated, may be physically separated from the first ground bar 110. The second ground bar 120 may be dedicated to charged components. A charged component does not operate by receiving electricity, but refers to a component capable of generating current by charging. In other words, the charged component does not generate current in a normal case, but a high level of current may be generated in a specific situation (e.g., static electricity generation). The charged component may be, for example, at least one of a pipe through which a processing liquid flows (for example, a pipe made of a plastic material), a chuck, and a bowl, but is not limited thereto.

The second ground bar 120 may be electrically connected to the first charged component (CE1) and set a path of an electrostatic discharge current generated by the first charged component (CE1). Specifically, the first charged component (CE1) is connected to the second ground bar 120 through the wiring 91b, and the second ground bar 120 is connected to the building ground (BG) through the wiring 98. Accordingly, the path of the electrostatic discharge current of the first charged component (CE1) reaches the building ground (BG) through the wiring 91b, the second ground bar 120 and the wiring 98.

In particular, since the substrate processing system according to the first embodiment of the present invention uses the first ground bar 110 and the second ground bar 120 that are physically separated, even if static electricity is generated in the first charged component (CE1), the voltage level of the first ground bar 110 is relatively less affected. That is, when static electricity is generated in the first charged component (CE1), the electrostatic discharge current flows to the building ground (BG) through the wiring 91b, the second ground bar 120, and the wiring 98. Accordingly, the voltage level of the second ground bar 120 rapidly increases. On the other hand, since the first ground bar 110 is physically separated from the second ground bar 120 and is connected by the wiring 99, the voltage level of the first ground bar 110 does not increase as rapidly as the voltage level of the second ground bar 120. When the first ground bar 110 and the second ground bar 120 are not connected by the wiring 99 and the first ground bar 110 is connected to the building ground 98 through a separate wiring, even if the voltage level of the second ground bar 120 increases rapidly, the effect on the voltage level of the first ground bar 110 is insignificant. Accordingly, the reference ground level of the first electrical component (EE1) connected to the first ground bar 110 is also less affected. That is, by using the first ground bar 110 and the second ground bar 120 that are physically separated, it is possible to stably handle electrostatic discharge (ESD) while maintaining a stable reference ground level of the electrical component.

Figure 2:
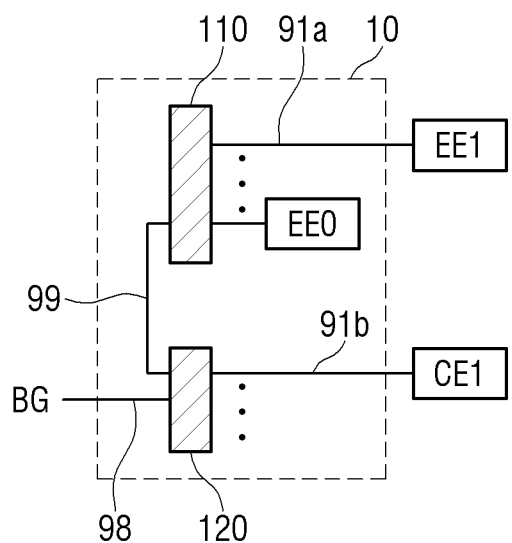
FIG. 2 is a block diagram for describing a substrate processing system according to a second embodiment of the present invention.

FIG. 2 is a block diagram for describing a substrate processing system according to a second embodiment of the present invention. For convenience of description, the differences from those described with reference to FIG. 1 will be mainly described.

Referring to FIG. 2, the substrate processing system according to the second embodiment of the present invention may include at least one electrical box 10.

For example, a first ground bar 110 and a second ground bar 120 may be arranged in the first electrical box 10. The first ground bar 110 may be connected to the first electrical component (EE1) outside the first electrical box 10 through the wiring 91a, and connected to the internal electrical component (EE0) inside the first electrical box 10 through wiring. The second ground bar 120 may be connected to the first charged component (CE1) outside the first electrical box 10 through the wiring 91b. The first ground bar 110 and the second ground bar 120 may be connected to each other through a wiring 99.

Figure 3:
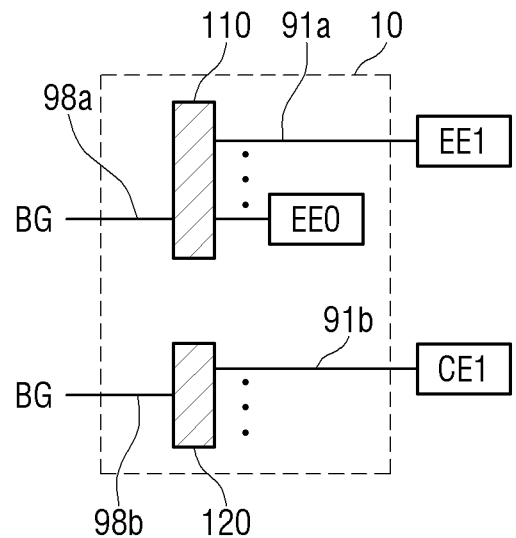
FIG. 3 is a block diagram for describing a substrate processing system according to a third embodiment of the present invention.

FIG. 3 is a block diagram for describing a substrate processing system according to a third embodiment of the present invention. For convenience of description, differences from those described with reference to FIGS. 1 and 2 will be mainly described.

In the substrate processing system shown in FIG. 2, the first ground bar 110 connected to the first electrical component (EE1) is connected to the building ground (BG) through the wiring 99, the second ground bar 120, and the wiring 98. On the other hand, in the substrate processing system shown in FIG. 3, the first ground bar 110 connected to the first electrical component (EE1) is directly connected to the building ground (BG) through the wiring 98a, and the second ground bar 120 connected to the first charged component (CE1) is directly connected to the building ground (BG) through the wiring 98b.

In this specification, when the ground bar is "directly connected" to the building ground (BG), it means that the ground bar is connected to the building ground (BG) "without passing through another ground bar."

Figure 4:
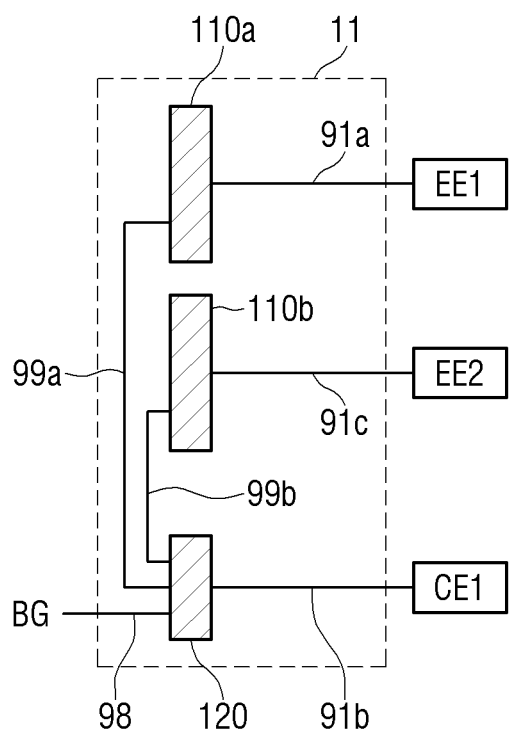
FIG. 4 is a block diagram for describing a substrate processing system according to a fourth embodiment of the present invention.

FIG. 4 is a block diagram for describing a substrate processing system according to a fourth embodiment of the present invention. For convenience of description, differences from those described with reference to FIGS. 1 to 3 will be mainly described.

Referring to FIG. 4, in the substrate processing system according to the fourth embodiment of the present invention, the first ground bar 110 may include at least two partial ground bars 110a and 110b physically separated from each other. At least two partial ground bars 110a and 110b and a second ground bar 120 may be arranged in the electrical box 11.

The first partial ground bar 110a is electrically connected to the first electrical component (EE1) to set the ground level of the first electrical component (EE1). Specifically, the first electrical component (EE1) is connected to the building ground (BG) through the wiring 91a, the first partial ground bar 110a, the wiring 99a, the second ground bar 120 and the wiring 98.

The second partial ground bar 110b is electrically connected to the second electrical component (EE2) to set the ground level of the second electrical component (EE2). Specifically, the second electrical component (EE2) is connected to the building ground (BG) through the wiring 91c, the second partial ground bar 110b, the wiring 99b, the second ground bar 120 and the wiring 98.

Here, the first electrical component (EE1) and the second electrical component (EE2) may be components having different electrical characteristics. For example, the first electrical component (EE1) may operate by receiving a first voltage, and the second electrical component (EE2) may operate by receiving a second voltage different from the first voltage. The first voltage may be an AC voltage, and the second voltage may be a DC voltage. Specifically, the effective value of the AC voltage may be greater than the DC voltage. For example, the effective value of the AC voltage may be 220V, and the DC voltage may be 24V. Further, the second voltage (DC voltage) may be obtained by rectifying the first voltage (AC voltage). Further, the first electrical component (EE1) may include a motor or a heater, and the second electrical component (EE2) may include a sensor.

As described above, the first electrical component (EE1) and the second electrical component (EE2) having different electrical characteristics are connected to different partial ground bars 110a and 110b. Specifically, for example, the first electrical component (EE1) is operated by a voltage having a relatively higher voltage level than the second electrical component (EE2). In the case of the first electrical component (EE1), for example, the shift of 5V in the reference voltage level is not a big change, but in the case of the second electrical component (EE2), the shift of 5V in the reference voltage level may be quite a big change. When the first electrical component (EE1) and the second electrical component (EE2) are connected to different partial ground bars 110a and 110b, for example, a shift of the 5V voltage level at the first partial ground bar 110a does not affect the second partial ground bar 110b. Accordingly, the electric components having different electrical characteristics (EE1 and EE2) as described above use different ground bars 110a and 110b.

Further, although it has been described that there are two partial ground bars 110a and 110b in FIG. 4, the present invention is not limited thereto. Depending on the electrical characteristics of the electrical components used, three or more partial ground bars may be used.

Meanwhile, in FIG. 4, it is illustrated that the first partial ground bar 110a and the second ground bar 120 are connected through the wiring 99a, and the second partial ground bar 110b and the second ground bar 120 are connected through the wiring 99b, but it is not limited thereto. For example, similar to FIG. 3, the first partial ground bar 110a may be directly connected to the building ground (BG) through a separate wiring, and the second partial ground bar 110b may be directly connected to the building ground (BG) through a separate wiring.

Figure 5:
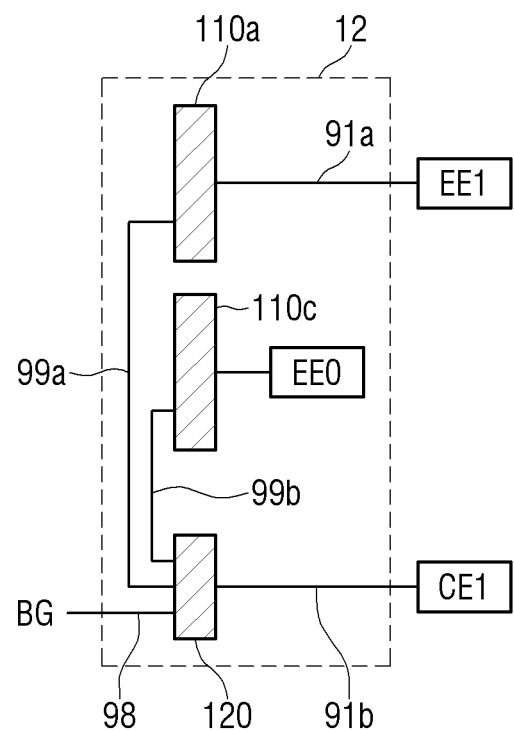
FIG. 5 is a block diagram for describing a substrate processing system according to a fifth embodiment of the present invention.

FIG. 5 is a block diagram for describing a substrate processing system according to a fifth embodiment of the present invention. For convenience of description, differences from those described with reference to FIGS. 1 to 4 will be mainly described.

Referring to FIG. 5, in the substrate processing system according to the fifth embodiment of the present invention, the first ground bar 110 may include at least two partial ground bars 110a and 110c physically separated from each other. The first partial ground bar 110a is electrically connected to the first electrical component (EE1) outside the electrical box 12 to set the ground level of the first electrical component (EE1). The second partial ground bar 110c may be connected to the internal electrical component (EE0) in the electrical box 12 through wiring. The internal electrical component (EE0) is connected to the building ground (BG) through the second partial ground bar 110c, the wiring 99b, the second ground bar 120 and the wiring 98.

Figure 6:
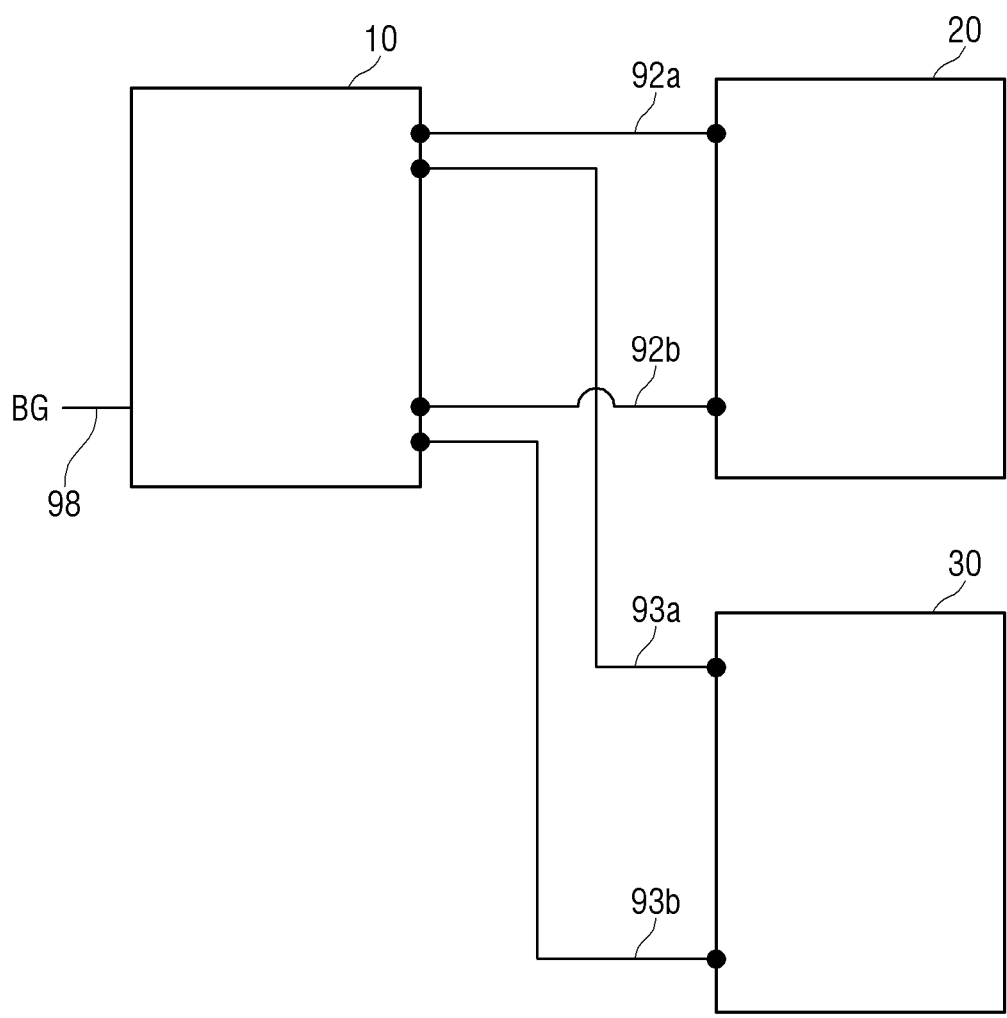
FIG. 6 is a block diagram for describing a substrate processing system according to a sixth embodiment of the present invention.
Figure 7:
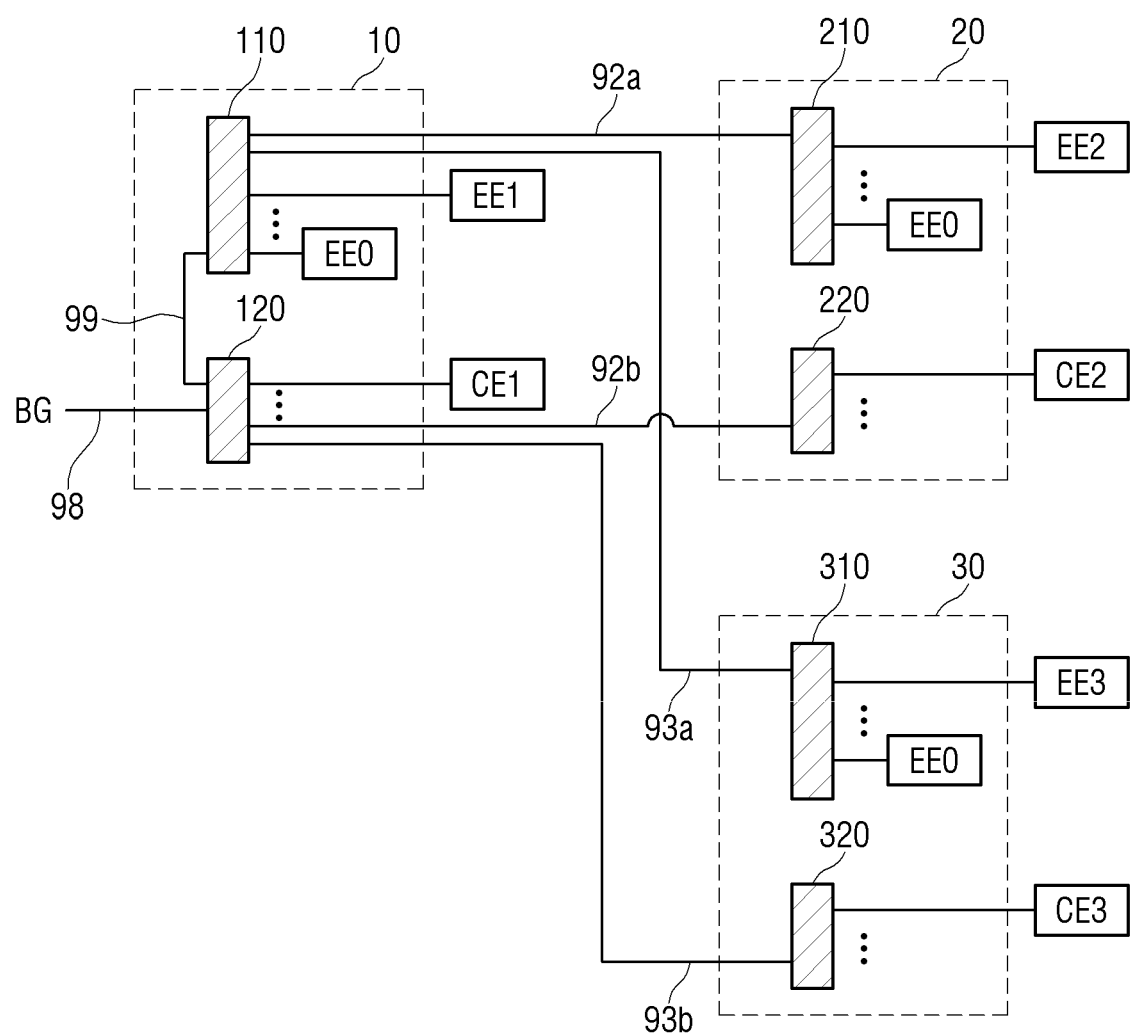
FIG. 7 is a diagram illustrating the substrate processing system shown in FIG. 6 in detail.
Figure 8:
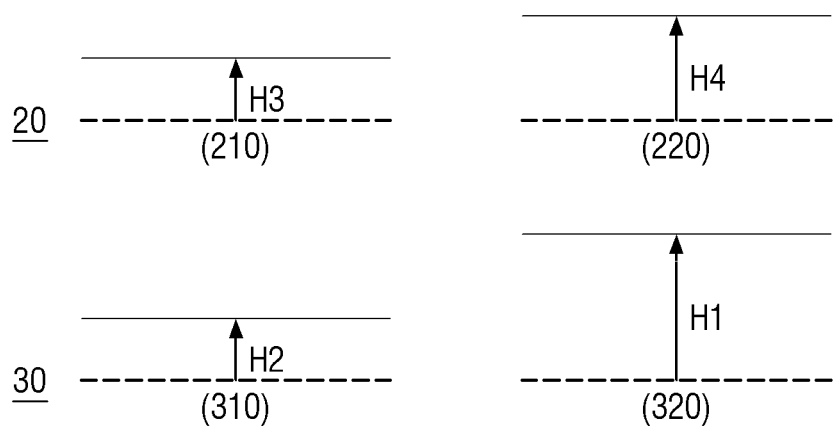
FIG. 8 is a diagram for describing the effect of the substrate processing system shown in FIG. 6.

FIG. 6 is a block diagram for describing a substrate processing system according to a sixth embodiment of the present invention. FIG. 7 is a diagram illustrating the substrate processing system shown in FIG. 6 in detail. FIG. 8 is a diagram for describing the effect of the substrate processing system shown in FIG. 6. For convenience of description, contents substantially the same as those described using the previous drawings will be omitted.

First, referring to FIG. 6, a substrate processing system according to a sixth embodiment of the present invention includes a plurality of electrical boxes 10, 20, and 30.

The first electrical box 10 may be connected to the building ground (BG), and the second electrical box 20 and the third electrical box 30 may be electrically connected to the building ground (BG) through the first electrical box 10. In particular, the second electrical box 20 is connected to the first electrical box 10 through at least two different wirings 92a and 92b for ground connection. Likewise, the third electrical box 30 is connected to the first electrical box 10 through at least two different wiring 93a and 93b for ground connection.

Referring to FIG. 7, the first electrical box 10 includes a first ground bar 110 and a second ground bar 120 that are physically separated from each other. The second electrical box 20 includes a third ground bar 210 and a fourth ground bar 220 that are physically separated from each other. The third electrical box 30 includes a fifth ground bar 310 and a sixth ground bar 320 that are physically separated from each other.

The first to sixth ground bars 110 to 320 may be connected to each other through a plurality of wirings 92a, 92b, 93a, 93b, and the like. The plurality of wirings 92a, 92b, 93a, 93b, etc. may have a tree shape. Specifically, the first wiring trees 92a and 93a connect the first ground bar 110, the third ground bar 210, and the fifth ground bar 310. That is, the first ground bar 110 is connected to the third ground bar 210 through the wiring 92a and is connected to the fifth ground bar 310 through the wiring 93a. Similarly, the second wiring trees 92b and 93b connect the second ground bar 120, the fourth ground bar 220, and the sixth ground bar 320. That is, the second ground bar 120 is connected to the fourth ground bar 220 through the wiring 92b and the sixth ground bar 320 through the wiring 93b.

Here, the first wiring trees 92a and 93a and the second wiring trees 92b and 93b may be mutually exclusive. That is, the first wiring trees 92a and 93a are not connected to the fourth ground bar 220 and the sixth ground bar 320. The second wiring trees 92b and 93b are not connected to the third ground bar 210 and the fifth ground bar 310.

The first wiring trees 92a and 93a and the second wiring trees 92b and 93b may be used for different purposes. That is, the first wiring trees 92a and 93a are used to set the ground level (reference level) of at least one of electrical components (EE1, EE2, and EE3). The second wiring trees 92b and 93b may be used exclusively for electrostatic discharge (ESD) of at least one of the charged components (CE1, CE2, and CE3).

Meanwhile, in FIG. 7, in the first electrical box 10, the first ground bar 110 and the second ground bar 120 are shown to be connected to each other by a wiring 99, but the present invention is not limited thereto. Similar to that described with reference to FIG. 3, each of the first ground bar 110 and the second ground bar 120 may be directly connected to the building ground (BG) by separate wirings.

On the other hand, a plurality of electrical boxes 10, 20 and 30 may be located in different substrate processing apparatuses. Some electrical boxes (e.g., 10) may be located in a first substrate processing apparatus, and other electrical boxes (e.g., 20, 30) may be located in a second substrate processing apparatus different from the first substrate processing apparatus. The electrical component (EE1) and the charged component (CE1) may be located in the first substrate processing apparatus, and the other electrical components (EE2 and EE3) and the other charged components (CE2 and CE3) may be located in the second substrate processing apparatus. Meanwhile, the controller should provide signals/instructions to electrical components (e.g., EE1, EE2) located in different substrate processing apparatuses. In some embodiments of the present invention, even if static electricity is generated in some of the charged components (e.g., CE3), errors do not occur when receiving/interpreting signals/instructions in the electrical components (e.g., EE1, EE2). The reason is as follows.

Here, referring to FIG. 8, when static electricity is generated in the charged component (CE3), the voltage level rise (H1) of the sixth ground bar 320 is very large.

In the second wiring trees 92b and 93b, the sixth ground bar 320 and the fourth ground bar 220 are electrically connected. That is, the sixth ground bar 320 is connected to the fourth ground bar 220 through the wiring 93b, the second ground bar 120, and the wiring 92b. Accordingly, the voltage level rise (H4) of the fourth ground bar 220 is considerably large according to the voltage level rise (H6) of the sixth ground bar 320.

If the charged component (e.g., CE3) and the electrical component (e.g., EE3) are connected to the same ground bar, the static electricity generated from the charged component (CE3) will directly affect the electrical component (EE3).

However, in the substrate processing system of the sixth embodiment of the present invention, the sixth ground bar 320, to which the charged component (CE3) is connected, is connected to the fifth ground bar 310, to which the electrical component (EE3) is connected, through the wiring 93b, the second ground bar 120, the wiring 99, the first ground bar 110 and the wiring 93a. Therefore, the effect of static electricity generated in the charged component (CE3) on the electrical component (EE3) is minor. As shown in FIG. 8, even if the voltage level of the sixth ground bar 320 increases rapidly, the voltage level increase (H2) of the fifth ground bar 310 (H2) and the voltage level increase (H3) of the third ground bar 210 (H3) are not large.

As a result, the difference between the voltage level rise (H2) of the fifth ground bar 310 and the voltage level rise (H3) of the third ground bar 210 (that is, the absolute value of the difference between H2 and H3) is smaller than the difference between the voltage level rise (H1) of the sixth ground bar 320 and the voltage level rise (H4) of the fourth ground bar 220 (i.e., the absolute value of the difference between H1 and H4).

Therefore, in a situation in which static electricity is generated in the charged component (e.g., CE3), even if the second electrical component (EE2) and the third electrical component (EE3) communicate with each other, since the difference between the voltage level of the third ground bar 210 (see H3) and the voltage level of the fifth ground bar 310 (see H2) is small, communication errors between the second electrical component (EE2) and the third electrical component (EE3) hardly occur. Likewise, in a situation in which static electricity is generated in a charged component (e.g., CE3), even if the controller provides a signal/instruction to the second electrical component (EE2) and the third electrical component (EE3), the errors hardly occur. That is, the substrate processing system according to the sixth embodiment of the present invention can stably handle electrostatic discharge current and minimize signal/instruction errors of electrical components.

Figure 9:
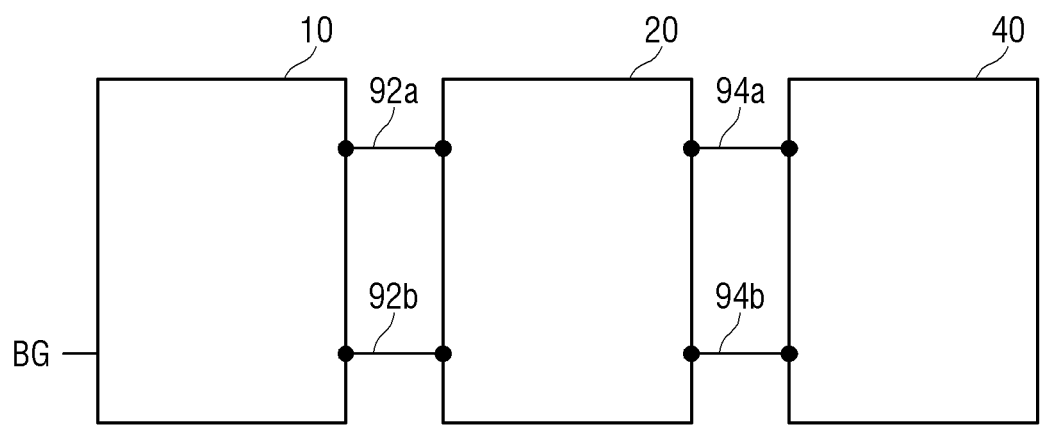
FIG. 9 is a block diagram for describing a substrate processing system according to a seventh embodiment of the present invention.
Figure 10:
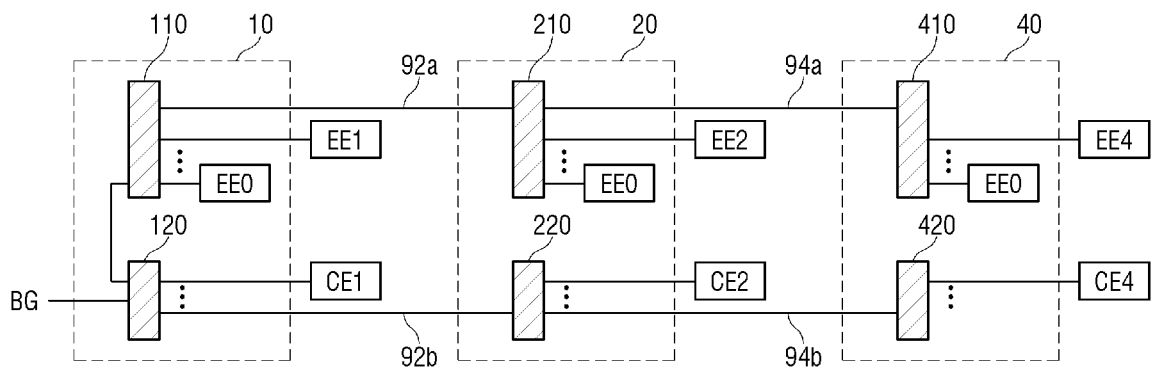
FIG. 10 is a diagram illustrating the substrate processing system shown in FIG. 9 in detail.

FIG. 9 is a block diagram for describing a substrate processing system according to a seventh embodiment of the present invention. FIG. 10 is a diagram illustrating the substrate processing system shown in FIG. 9 in detail. For convenience of description, contents substantially the same as those described using the previous drawings will be omitted.

First, referring to FIG. 9, a substrate processing system according to a seventh embodiment of the present invention comprises a plurality of electrical boxes 10, 20, and 40.

The first electrical box 10 may be directly connected to the building ground (BG), the second electrical box 20 may be connected to the building ground (BG) through the first electrical box 10, and the fourth electrical box 40 may be connected to the building ground (BG) through the second electrical box 20 and the first electrical box 10. In particular, the second electrical box 20 is connected to the first electrical box 10 through at least two different wirings 92a and 92b for ground connection. Likewise, the fourth electrical box 40 is connected to the second electrical box 20 through at least two different wirings 94a and 94b for ground connection.

Referring to FIG. 10, the first electrical box 10 includes a first ground bar 110 and a second ground bar 120 that are physically separated from each other. The second electrical box 20 includes a third ground bar 210 and a fourth ground bar 220 that are physically separated from each other. The fourth electrical box 40 includes a seventh ground bar 410 and an eighth ground bar 420 that are physically separated from each other.

The first ground bar 110 to the fourth ground bar 220, the seventh ground bar 410, and the eighth ground bar 420 may be connected to each other through a plurality of wirings 92a, 92b, 93a, 93b, 94a, 94b, etc. The plurality of wirings 92a, 92b, 93a, 93b, 94a, 94b, etc. may have a tree shape.

Specifically, the third wiring trees 92a and 94a connect the first ground bar 110, the third ground bar 210, and the seventh ground bar 410. That is, the first ground bar 110 is connected to the third ground bar 210 through the wiring 92a and the seventh ground bar 410 through the wiring 94a. Similarly, the fourth wiring trees 92b and 94b connect the second ground bar 120, the fourth ground bar 220, and the eighth ground bar 420. That is, the second ground bar 120 is connected to the fourth ground bar 220 through the wiring 92b and the seventh ground bar 410 through the wiring 94b. Here, the third wiring trees 92a and 94a and the fourth wiring trees 92b and 94b may be mutually exclusive. That is, the third wiring trees 92a and 94a are not connected to the fourth ground bar 220 and the eighth ground bar 420. The fourth wiring trees 92b and 94b are not connected to the third ground bar 210 and the seventh ground bar 410.

Figure 11:
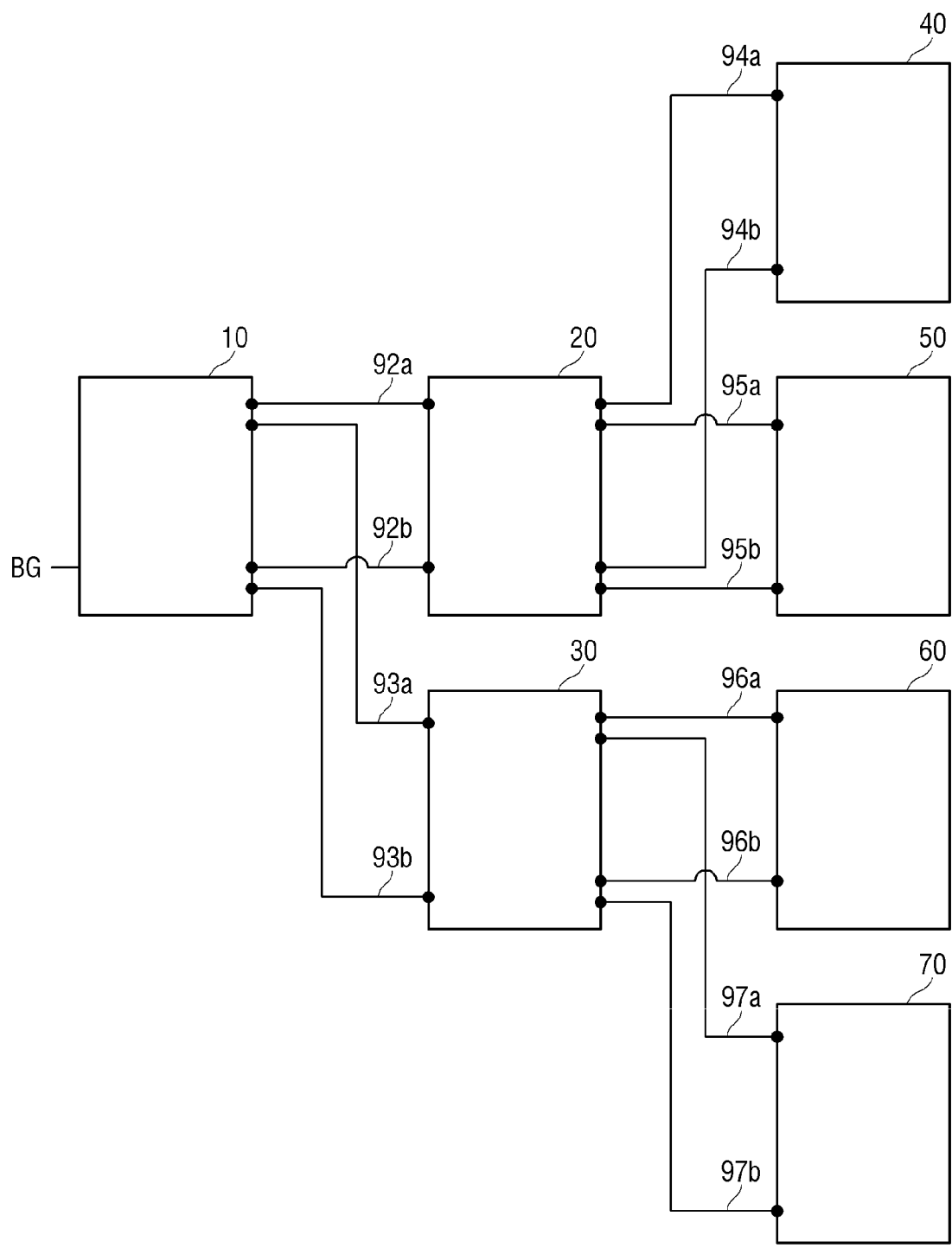
FIG. 11 is a block diagram for describing a substrate processing system according to an eighth embodiment of the present invention.

FIG. 11 is a block diagram illustrating a substrate processing system according to an eighth embodiment of the present invention. For convenience of description, contents substantially the same as those described using the previous drawings will be omitted.

Referring to FIG. 11, a substrate processing system according to an eighth embodiment of the present invention includes a plurality of electrical boxes 10, 20, 30, 40, 50, 60 and 70.

As described above, each of the electrical boxes 10, 20, 30, 40, 50, 60 and 70 includes two or more ground bars physically separated from each other therein.

The first electrical box 10 may be directly connected to the building ground (BG), and the second electrical box 20 and the third electrical box 30 may be connected to the building ground (BG) through the first electrical box 10. The fourth electrical box 40 and the fifth electrical box 50 may be connected to the building ground (BG) through the second electrical box 20 and the first electrical box 10. The sixth electrical box 60 and the seventh electrical box 70 may be connected to the building ground (BG) through the third electrical box 30 and the first electrical box 10.

In particular, the fourth electrical box 40 is connected to the second electrical box 20 through at least two different wirings 94a and 94b for ground connection. The fifth electrical box 50 is connected to the second electrical box 20 through at least two different wirings 95a and 95b for ground connection. The sixth electrical box 60 is connected to the third electrical box 30 through at least two different wirings 96a and 96b for ground connection. The seventh electrical box 70 is connected to the third electrical box 30 through at least two different wirings 97a and 97b for ground connection.

The wirings 92a, 93a, 94a, 95a, 96a, and 97a may be dedicated to electrical components, and the wirings 92b, 93b, 94b, 95b, 96b, and 97b may be dedicated to charged components. The wirings 92a, 93a, 94a, 95a, 96a, and 97a are used to set the ground level of the electrical component. The wirings 92b, 93b, 94b, 95b, 96b, and 97b may be used exclusively for electrostatic discharge of a charged component.

In FIG. 11, as an example, a form, in which seven electrical boxes 10, 20, 30, 40, 50, 60, 70 are connected in series and parallel to each other, is described, but the present invention is not limited thereto. Eight or more electrical boxes may be connected to each other in series and parallel.

Further, a plurality of electrical boxes 10, 20, 30, 40, 50, 60, 70 may be located in different substrate processing apparatuses. Some electrical boxes (e.g., 10) may be located in the first substrate processing apparatus, some electrical boxes (e.g., 20, 30, 40) are located in the second substrate processing apparatus different from the first substrate processing apparatus, and other electrical boxes (e.g., 50, 60, 70) may be located in a third substrate processing apparatus different from the first and second substrate processing apparatuses.

Figure 12:
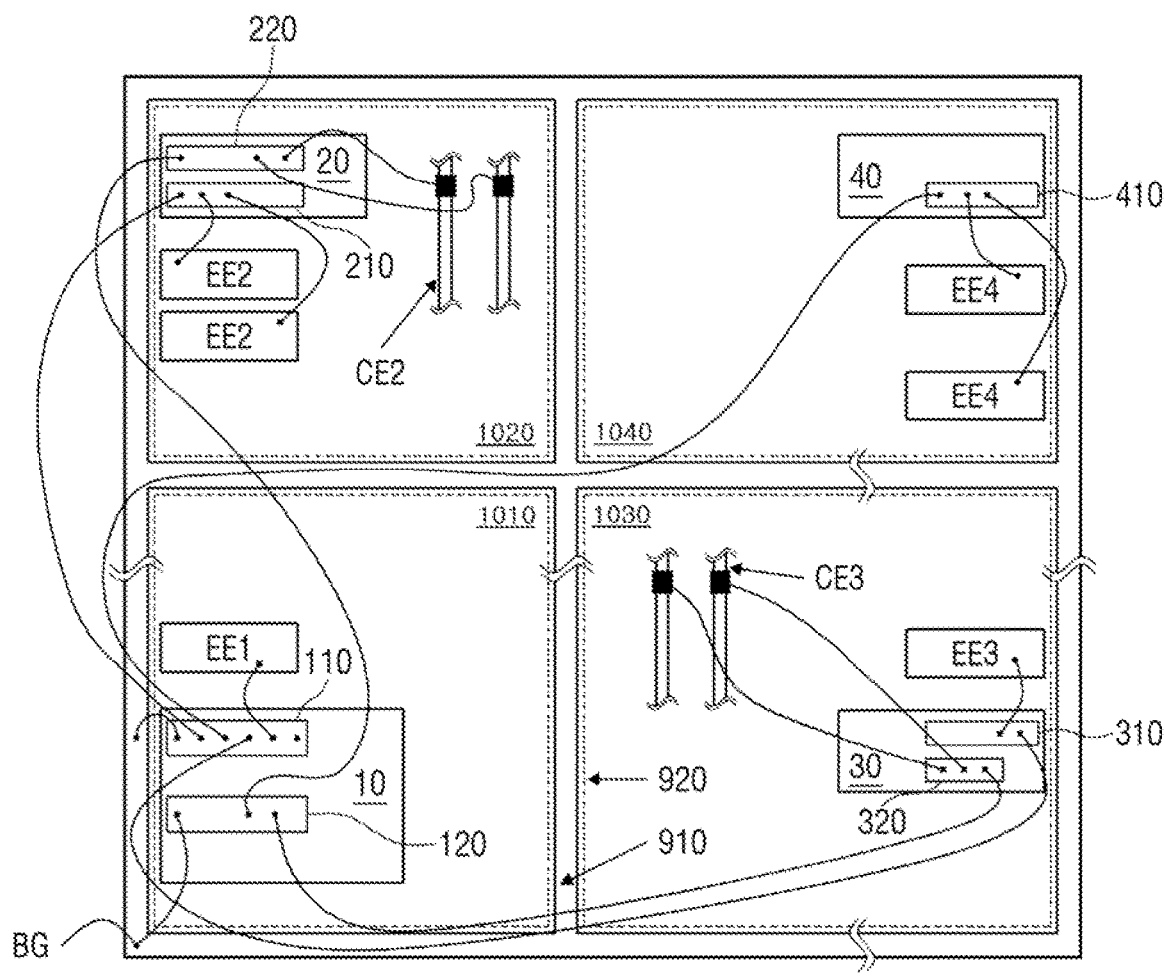
FIGS. 12 and 13 are schematic conceptual diagrams for describing a substrate processing system according to a ninth embodiment of the present invention.
Figure 13:
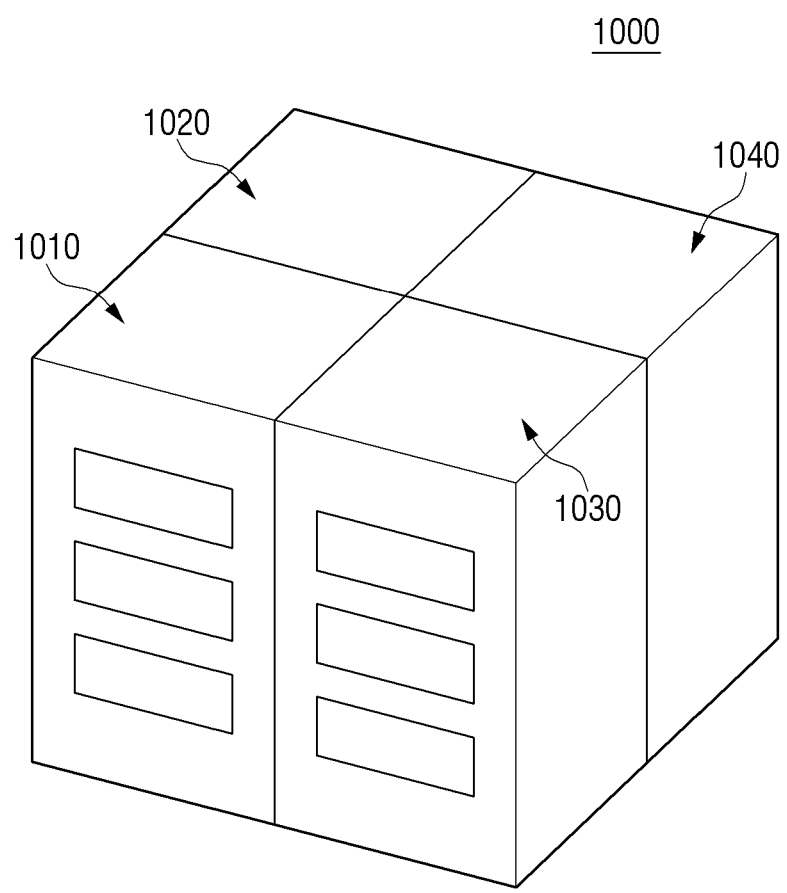

FIGS. 12 and 13 are schematic conceptual diagrams for describing a substrate processing system according to a ninth embodiment of the present invention. For convenience of description, contents substantially the same as those described using the previous drawings will be omitted.

Referring to FIGS. 12 and 13, the substrate processing system 1000 according to the ninth embodiment of the present invention may include, for example, four substrate processing apparatuses 1010, 1020, 1030, and 1040. Each of the substrate processing apparatuses 1010, 1020, 1030, and 1040 may be a substrate processing apparatus using a processing liquid (e.g., a cleaning facility or a photo facility). Each of the substrate processing apparatuses 1010, 1020, 1030, and 1040 includes a plurality of chambers (e.g., three chambers) therein, and may perform a cleaning or photo process in each chamber.

The substrate processing system 1000 according to the ninth embodiment of the present invention includes, for example, a frame 910 made of steel, and a coating material 920 for insulatingly coating the frame 910 (refer to the dotted line).

A first electrical box 10 is located in the substrate processing apparatus 1010, and a first ground bar 110 and a second ground bar 120 are arranged therein. Further, at least one electrical component (EE1) connected to the first ground bar 110 and a charged component connected to the second ground bar 120 may be arranged in the substrate processing apparatus 1010.

A second electrical box 20 is located in the substrate processing apparatus 1020, and a third ground bar 210 and a fourth ground bar 220 are arranged therein. Further at least one electrical component (EE2) connected to the third ground bar 210 and a charged component (CE2) connected to the fourth ground bar 220 may be arranged in the substrate processing apparatus 1020.

A third electrical box 30 is located in the substrate processing apparatus 1030, and a fifth ground bar 310 and a sixth ground bar 320 are arranged therein. Further, at least one electrical component (EE3) connected to the fifth ground bar 310 and a charged component (CE3) connected to the sixth ground bar 320 may be arranged in the substrate processing apparatus 1030.

A fourth electrical box 40 may be located in the substrate processing apparatus 1040, and a seventh ground bar 410 may be arranged therein. Further, at least one electrical component (EE4) connected to the seventh ground bar 410 may be arranged in the substrate processing apparatus 1040.

As shown, the third ground bar 210, the fifth ground bar 310, and the seventh ground bar 410 are connected to the first ground bar 110 through wiring, and the first ground bar 110 is directly connected to the building ground (BG) through the frame 910. The fourth ground bar 220 and the sixth ground bar 320 are connected to the second ground bar 120 through wiring, and the second ground bar 120 is directly connected to the building ground (BG) through the frame 910.

In the figures, each of the substrate processing apparatuses 1010, 1020, 1030, and 1040 is illustrated as being fixed by or in contact with the frame 910, but is not limited thereto.

On the other hand, in the interior of the substrate processing apparatus (at least one of 1010, 1020, 1030, 1040), which is not shown, a chuck for supporting a substrate, a bowl installed to surround the chuck, a processing liquid nozzle for supplying a processing liquid to the substrate, a processing liquid pipe connected to the processing liquid nozzle, and a drain for discharging a used processing liquid may be included. The chuck may be, for example, a spin chuck, an electrostatic chuck, or the like, and is not limited to a specific type. The bowl is of the type surrounding the chuck and may be more than one. Depending on the operation of the substrate processing apparatus, the bowl may perform a lifting/lowering operation. The processing liquid nozzle may perform a forward/retreat operation or an arc motion according to the operation of the substrate processing apparatus. The drain is located under the processing space, in which the chuck, bowl, etc. are installed, and is for the processing liquid used in substrate processing to escape to the outside.

Although the embodiments of the present invention have been described with reference to the above and the accompanying drawings, those skilled in the art, to which the present invention pertains, can understand that the present invention may be implemented in other specific forms without changing its technical spirit or essential features. Therefore, it should be understood that the embodiments described above are illustrative and non-limiting in all aspects.

What is claimed is:

1. A system for processing a substrate comprising:
a first ground bar connected to a building ground; and
a second ground bar connected to a building ground and physically separated from the first ground bar,
wherein the first ground bar and the second ground bar are arranged separately from each other in an electrical box,
wherein the first ground bar is connected to a first electrical component to set a ground level of the first electrical component,
wherein the second ground bar is dedicated to a charged component, and the second ground bar is connected to a first charged component to set a path of an electrostatic discharge current generated by the first charged component.

2. The system of claim 1, wherein the first ground bar comprises a first partial ground bar and a second partial ground bar physically separated from each other,
wherein the first partial ground bar is connected to the first electrical component operated by receiving a first voltage,
wherein the second partial ground bar is connected to a second electrical component operated by receiving a second voltage smaller than the first voltage.

3. The system of claim 2, wherein the first voltage is an alternating current voltage, and the second voltage is a direct current voltage.

4. The system of claim 1 further comprises a third ground bar and a fourth ground bar physically separated from each other,
wherein the third ground bar is interposed between the first ground bar and the first electrical component, and the first electrical component is connected to the first ground bar through the third ground bar,
wherein the fourth ground bar is interposed between the second ground bar and the first charged component, and the first charged component is connected to the second ground bar through the fourth ground bar.

5. The system of claim 4 further comprises,
a fifth ground bar and a sixth ground bar physically separated from each other,
a second electrical component different from the first electrical component, and
a second charged component different from the first charged component,
wherein the fifth ground bar is interposed between the first ground bar and the second electrical component, and the second electrical component is connected to the first ground bar through the fifth ground bar,
wherein the sixth ground bar is interposed between the second ground bar and the second charged component, and the second charged component is connected to the second ground bar through the sixth ground bar.

6. The system of claim 5, wherein the first ground bar and the second ground bar are located in a first substrate processing apparatus,
wherein the third ground bar and the fourth ground bar are located in a second substrate processing apparatus different from the first substrate processing apparatus,
wherein the fifth ground bar and the sixth ground bar are located in a third substrate processing apparatus different from the first substrate processing apparatus and the second substrate processing apparatus.

7. The system of claim 1, wherein the substrate processing system is installed in a cleaning facility or a photo facility using at least one processing liquid.

8. The system of claim 1 further comprises,
a chuck for supporting a substrate,
a bowl installed to surround the chuck,
a processing liquid nozzle for supplying a processing liquid onto the substrate,
a processing liquid pipe connected to the processing liquid nozzle, and
a drain for discharging a used processing liquid.

9. The system of claim 1, wherein the first electrical component includes a motor or a heater,
wherein the first charged component includes at least one of a processing liquid pipe, a chuck, and a bowl.

10. A system for processing a substrate comprising:
a first electrical box including a first ground bar connected to a building ground, and a second ground bar connected to the building ground and physically separated from the first ground bar;
a second electrical box including a third ground bar and a fourth ground bar physically separated from each other; and
a third electrical box including a fifth ground bar and a sixth ground bar physically separated from each other,
wherein a first wiring tree connects the first ground bar, the third ground bar, and the fifth ground bar,
wherein a second wiring tree connects the second ground bar, the fourth ground bar, and the sixth ground bar,
wherein the first wiring tree is not connected to the fourth ground bar and the sixth ground bar.

11. The system of claim 10, wherein the second wiring tree is used exclusively for electrostatic discharge (ESD) of a charged component, wherein the first wiring tree is used for setting a ground level of an electrical component.

12. The system of claim 10, wherein the first ground bar comprises a first partial ground bar and a second partial ground bar physically separated from each other,
wherein the first partial ground bar is connected to a first electrical component operated by receiving a first voltage,
wherein the second partial ground bar is connected to a second electrical component operated by receiving a second voltage smaller than the first voltage.

13. The system of claim 12, wherein the first voltage is an alternating current voltage and the second voltage is a direct current voltage obtained by rectifying the alternating current voltage.

14. The system of claim 13, wherein the first electrical component includes a motor or a heater, and the second electrical component includes a sensor.

15. The system of claim 10, wherein at least one of the first electrical box, the second electrical box, and the third electrical box is located in a first substrate processing apparatus, wherein at least another one of the first electrical box, the second electrical box, and the third electrical box is located in a second substrate processing apparatus different from the first substrate processing apparatus.

16. The system of claim 10 further comprises a first connection wiring connecting one of the first ground bar and the second ground bar to the building ground, and
a second connection wiring connecting the first ground bar and the second ground bar to each other.

17. A system for processing a substrate comprising:
a first electrical box including a first ground bar connected to a building ground, and a second ground bar connected to the building ground and physically separated from the first ground bar;
a second electrical box including a third ground bar and a fourth ground bar physically separated from each other;
a third electrical box including a fifth ground bar and a sixth ground bar physically separated from each other;
a first electrical component connected to a building ground through a third ground bar and a first ground bar;
a second electrical component connected to a building ground through a fifth ground bar and a first ground bar;
a first charged component connected to a building ground through a fourth ground bar and a second ground bar; and a second charged component connected to a building ground through a sixth ground bar and a second ground bar, wherein when static electricity is generated in the second charged component, a voltage level of a third ground bar to a sixth ground bar increases, but difference between a voltage level of the third ground bar and a voltage level of the fifth ground bar is smaller than difference between a voltage level of the fourth ground bar and a voltage level of the sixth ground bar.

18. The system of claim 17, wherein the first ground bar includes a first partial ground bar and a second partial ground bar physically separated from each other, wherein the first partial ground bar is connected to the first electrical component operated by receiving a first voltage, wherein the second partial ground bar is connected to the second electrical component operated by receiving a second voltage smaller than the first voltage.

19. The system of claim 18, wherein the first voltage is an alternating current voltage and the second voltage is a direct current voltage.

20. The system of claim 17 further comprises a first connection wiring connecting one of the first ground bar and the second ground bar to the building ground, and a second connection wiring connecting the first ground bar and the second ground bar to each other.

* * * * *